United States Patent [19]

Shioya et al.

[11] Patent Number: 4,625,678

[45] Date of Patent: Dec. 2, 1986

[54] APPARATUS FOR PLASMA CHEMICAL VAPOR DEPOSITION

[75] Inventors: Yoshimi Shioya, Yokohama; Mamoru Maeda, Tama; Yasushi Ohyama, Kodaira; Mikio Takagi, Kawasaki, all of Japan

[73] Assignee: Fujitsu Limited, Kawasaki, Japan

[21] Appl. No.: 740,306

[22] Filed: Jun. 3, 1985

Related U.S. Application Data

[63] Continuation of Ser. No. 498,561, May 26, 1983, abandoned.

[30] Foreign Application Priority Data

May 28, 1982 [JP] Japan .................................. 57-90678

[51] Int. Cl.$^4$ ........................ H01L 21/20; C23C 13/08
[52] U.S. Cl. .................................... 118/723; 118/724; 118/725; 118/50.1
[58] Field of Search ...................... 118/724, 723, 50.1, 118/725, 64; 427/39

[56] References Cited

U.S. PATENT DOCUMENTS

| 3,294,059 | 12/1966 | Baines et al. | 118/725 |
| 3,843,392 | 10/1974 | Sterling et al. | 427/39 X |
| 3,850,679 | 11/1974 | Sopko et al. | 118/718 X |
| 3,893,876 | 7/1975 | Akai et al. | 118/729 X |
| 4,436,770 | 3/1984 | Nishizawa et al. | 427/39 X |
| 4,438,154 | 3/1984 | Kato et al. | 427/39 |
| 4,446,168 | 5/1984 | Kato et al. | 427/39 |

FOREIGN PATENT DOCUMENTS 56-112461 9/1981 Japan .................................. 427/39

Primary Examiner—Richard Bueker
Attorney, Agent, or Firm—Staas & Halsey

[57] ABSTRACT

A plasma CVD apparatus for forming a deposited film on a base body by introducing a gas of a compound into a chamber and converting the gas into plasma by applying a high frequency electric power, includes a gas feeding pipe leading from the exterior of the chamber into the interior of the chamber, and a heating device. The heating device heats at least a part of the gas feeding pipe inside the chamber, thereby preventing the gas from condensing or solidifying. With this apparatus, plasma CVD can stably be carried out using gases of various compounds which are liquid or solid at room temperature.

6 Claims, 3 Drawing Figures

1

APPARATUS FOR PLASMA CHEMICAL VAPOR DEPOSITION

This is a continuation of co-pending application Ser. No. 498,561, filed on May 26, 1983, now abandoned.

BACKGROUND OF THE INVENTION

1. Field of the Invention

The invention relates to an apparatus for plasma chemical vapor deposition (hereinbelow, chemical vapor deposition is referred to as CVD). More particularly, the invention relates to a plasma CVD apparatus in which a silicide or metal film for a circuit pattern is formed on a substrate for an integrated circuit.

2. Description of the Prior Art

A low temperature plasma CVD apparatus has often been employed to form a silicide or metal film to be utilized as a gate electrode or wiring material for an integrated circuit.

Such an apparatus employs a gas of a compound which is liquid at room temperature, such as an inorganic fluoride compound, molybdenum fluoride ($MoF_6$), or tungsten fluoride ($WF_6$), or trimethyl aluminum $Al(CH_3)_3$, or titanium tetrachloride ($TiCl_4$). These compounds vaporize at room temperature and, thus, do not have to be heated. Gases of these compounds, however, may often condense on the wall of the gas feeding pipe provided in the apparatus, thus deteriorating the reproducibility in plasma CVD.

In the case of the use of a gas of a compound which is solid at room temperature, such as aluminum chloride ($AlCl_3$), molybdenum chloride ($MoCl_5$), tungsten chloride ($WCl_5$ or $WCl_6$), or another inorganic chloride compound, the gas of the compound may solidify at the middle of the gas feeding pipe of the apparatus, thus deteriorating the reproducibility in plasma CVD or blocking the gas feeding pipe.

Because of the above, a conventional plasma CVD apparatus can only use a limited range of compounds for the feeding gas. This often prevents obtaining a deposited film of a satisfactory adhesion strength or good quality.

SUMMARY OF THE INVENTION

It is the primary object of the present invention to provide a plasma CVD apparatus in which a gas of a compound which is liquid or solid at room temperature can advantageously be used, so that a deposited film having a high adhesion strength and a high quality is formed with a high reproducibility.

The present invention provides a plasma CVD apparatus for forming a deposited film on a base body by introducing a gas of a compound into a chamber, and converting the gas into plasma by applying high frequency electric power. The apparatus comprises a gas feeding means leading from the exterior of the chamber into the interior of the chamber and a heating means for heating at least a part of the gas feeding means inside of the chamber, thereby preventing the gas from condensing or solidifying.

DESCRIPTION OF THE PREFERRED EMBODIMENTS

Figure 1:
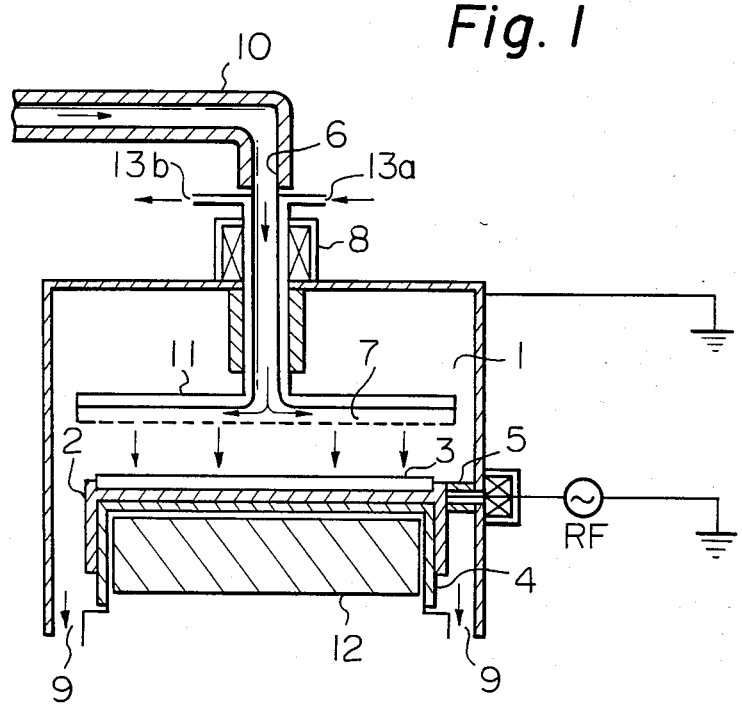
FIG. 1 is a schematic cross-sectional view of an embodiment of the apparatus according to the present invention.

Referring now to FIG. 1, the plasma CVD apparatus comprises a chamber 1, a susceptor 2 for supporting a substrate 3 to be treated, and a gas feeding pipe 6 leading from a gas source (not shown) through the gas inlet portion of the chamber into the inside of the chamber 1 and connected to a gas outlet member 7 in the inside of the chamber 1. The susceptor 2 is connected to a radio-frequency source (RF), thus forming a radio-frequency electrode. The susceptor 2 may thus advantageously be made of aluminum or stainless steel and is electrically insulated from the system by insulating members 4 and 5 made of an insulating material, such as quartz. Under the insulating member 4, there is located a heater 12 for heating the susceptor 2 and, thus, the substrate 3 to be treated. The susceptor 2 may optionally be rotated.

The gas feeding pipe 6 is provided with a heating cover 10 for heating the pipe 6 in a region from the gas source (not shown) to the gas inlet portion of the chamber 1 and a heating jacket 11 for heating the pipe 6 in a region from the gas inlet portion of the chamber to the gas outlet member 7 in the inside of the chamber and also heating the gas outlet member 7. The apparatus has a sealing member 8 at the gas inlet portion of the chamber 1. The heating cover may be of a type including an electrical resistance heater.

In the apparatus, a silicide or metal film is formed on a substrate 3 located on the susceptor 2 by applying a radio-frequency voltage between the radio-frequency electrode system consisting of the susceptor 2 and the electrode system consisting of the gas outlet member 7 to generate plasma and convert the gas into activated particles. The chamber 1 is evacuated through evacuation openings 9 to maintain the inside of the chamber at a desired pressure.

In the course of study leading to this invention, the inventors first developed a plasma CVD apparatus as illustrated in FIG. 1 having only the heating cover 10 but not having the heating jacket 11. They found, however, that such an apparatus was still insufficient to solve the problems as mentioned hereinbefore. Therefore, the inventors made further extensive studies and achieved the above-mentioned apparatus according to the present invention.

Figure 2:
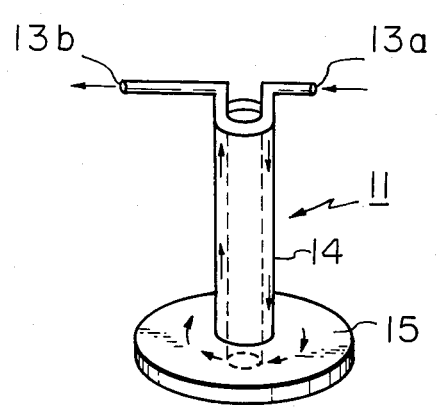
FIG. 2 is a schematic perspective view of an embodiment of the heating means for heating the gas feeding pipe leading from the gas inlet of the chamber to the gas outlet, and the gas outlet.

Thus, the apparatus according to the present invention has a heating means, such as the heating jacket 11 in FIG. 1, for heating the gas feeding pipe leading from the gas inlet portion of the chamber to the gas outlet member in the inside of the chamber and for heating the gas outlet member. The apparatus also includes a heating means, such as the heating cover 10 in FIG. 1, for heating the gas feeding pipe leading from the gas source to the gas inlet portion of the chamber. The heating jacket 11 shown in FIG. 1 may have a construction as illustrated in FIG. 2. The jacket 11 comprises a double cylindrical member 14 which has a cavity at the peripheral portion and a circular bottom plate 15 which also has a cavity connected to the cavity of the double cylindrical member 14. A heating medium, such as hot air, is introduced into the jacket 11 through the inlet 13a and removed from the outlet 13b, thereby heating the gas feeding pipe in contact with the double cylindrical member 14 and the gas outlet member in contact with the bottom plate 15. Of course, the heating jacket 11 may be of the electrical resistanced heater type.

Figure 3:
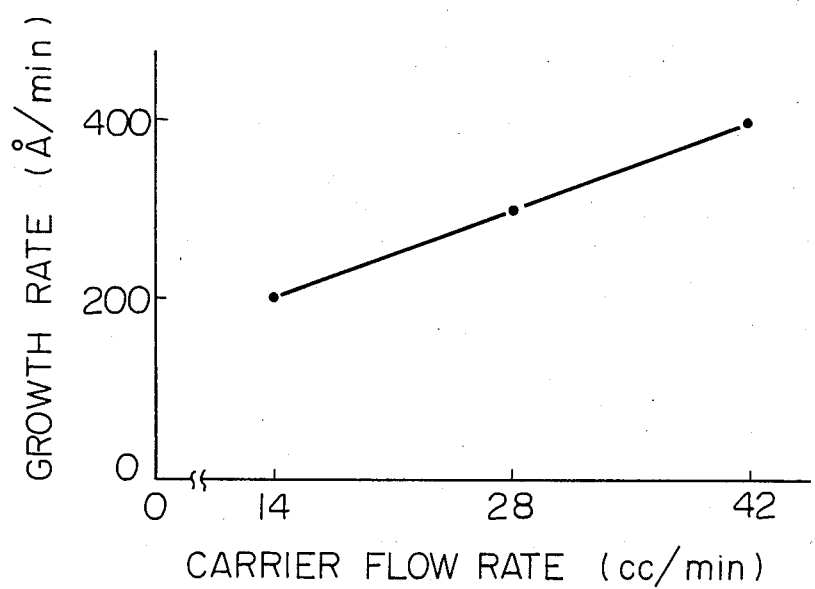
FIG. 3 is a graph of the relationship between the carrier flow rate and the growth rate of a deposited film.

Using the apparatus illustrated in FIG. 1, a molybdenum film was deposited onto, for example, an insulating layer on a single-crystal silicon wafer. A gas of molybdenum chloride ($MoCl_5$) was heated to a temperature of 100° C. to 120° C. and fed into the chamber 1. Argon gas was used as a carrier gas. The gas feeding pipe 6 and the gas outlet member 7 were heated to 150° C. by means of the heating cover 10 and the heating jacket 11. The chamber was evacuated to a pressure of 1 torr. and the temperature of the wafer surface was 400° C. The resultant growth rate of the molybdenum film versus the flow rate of the carrier gas is seen from the graph of FIG. 3.

According to the plasma CVD apparatus of the present invention, plasma CVD can stably be carried out using a gas of a compound which is liquid at room temperature, such as molybdenum fluoride, tungsten fluoride, trimethyl aluminum, or titanium tetrachloride, or using a gas of a compound which is solid at room temperature, such as aluminum chloride, molybdenum chloride, or tungsten chloride. Thus, various deposited films of metal silicides or metals can be formed on a substrate for an integrated circuit with excellent reproducibility. Further, according to the present invention, a silicide or metal film having high adhesion strength and high quality can be formed.

We claim:

1. An apparatus for plasma chemical vapor deposition on a base body using a gas of a compound which is liquid or solid at room temperature, the compound gas being converted into a plasma state, comprising:
   a plasma treating chamber having an evacuation opening to maintain the interior of said plasma treating chamber at a desired reduced pressure;
   a gas feed pipe extending from the exterior of said plasma treating chamber to the interior of said plasma treating chamber, for introducing the compound gas into said plasma treating chamber, said gas feed pipe having a gas outlet member in the interior of said plasma treating chamber;
   two electrodes, disposed substantially parallel to each other in said plasma treating chamber, for applying high frequency electric power to generate plasma, one of said two electrodes being a susceptor for supporting the base body and the other of said two electrodes being said gas outlet member;
   a heating jacket in heat conductive contact with at least the portion of said gas feed pipe in the interior of said plasma treating chamber and in heat conductive contact with said gas outlet member, said heating jacket for heating said gas feed pipe to prevent the compound gas from condensing or solidifying, said heating jacket including:
      a bottom plate in heat conductive contact with said gas outlet member, and having a first cavity; and
      a double cylindrical member having a second cavity connected to said first cavity, said double cylindrical member extending from said bottom plate and being in heat conductive contact with said gas feed pipe; and
   a heating cover in heat conductive contact with a portion of said gas feed pipe on the exterior of said plasma chamber.

2. An apparatus as claimed in claim 1, further comprising means for introducing a heating medium into said first and second cavities of said bottom plate and said double cylindrical member, respectively.

3. An apparatus as claimed in claim 2, wherein said heating medium is a hot gas.

4. An apparatus as claimed in claim 1, wherein said heating cover comprises an electrical resistance heater.

5. An apparatus as claimed in claim 1, further comprising a heater for heating said susceptor.

6. An apparatus as claimed in claim 1, further comprising means for rotating said susceptor.

* * * * *